(12) United States Patent
Kim

(10) Patent No.: US 7,705,459 B2
(45) Date of Patent: Apr. 27, 2010

(54) SEMICONDUCTOR DEVICES AND METHODS OF FORMING INTERCONNECTION LINES THEREIN

(75) Inventor: Sang-Kwon Kim, Suwon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 12/196,263

(22) Filed: Aug. 21, 2008

(65) Prior Publication Data

US 2008/0303156 A1   Dec. 11, 2008

Related U.S. Application Data

(62) Division of application No. 11/288,755, filed on Nov. 29, 2005, now Pat. No. 7,432,198.

(30) Foreign Application Priority Data

Dec. 17, 2004   (KR) .................. 10-2004-0107889

(51) Int. Cl.
*H01L 29/40* (2006.01)
(52) U.S. Cl. ................. 257/754; 257/775; 257/E23.164
(58) Field of Classification Search ................. 257/750, 257/754, 775, E23.152, E23.164
See application file for complete search history.

(56) References Cited

U.S. PATENT DOCUMENTS

| | | | |
|---|---|---|---|
| 4,648,937 A | 3/1987 | Ogura et al. | |
| 5,270,254 A | 12/1993 | Chen et al. | |
| 5,913,142 A | 6/1999 | Chang | |
| 6,051,885 A | 4/2000 | Yoshida | |
| 6,103,588 A | 8/2000 | Jeng et al. | |

(Continued)

FOREIGN PATENT DOCUMENTS

JP   4-352427 A   12/1992

(Continued)

OTHER PUBLICATIONS

Sang Kwon Kim; "Method for Fabricating Contact Plug of Semiconductor Device to Increase Contact Area of Lower Metal Interconnection and Contact Plug and Reduce Contact Resistance"; Korean Patent Publication No. 1020050066475 A; Publication Date: Jun. 30, 2005; Korean Intellectual Property Office; Republic of Korea.

(Continued)

*Primary Examiner*—W. David Coleman
*Assistant Examiner*—Sun M Kim
(74) *Attorney, Agent, or Firm*—The Law Offices of Andrew D. Fortney; Andrew D. Fortney; Sharon E. Brown Turner

(57) ABSTRACT

An example disclosed semiconductor device includes a semiconductor substrate, a lower interlayer insulating layer formed on the substrate, a lower wire formed on the lower interlayer insulating layer, and an upper interlayer insulating layer which is formed on the lower interlayer insulating layer and has a via hole to expose the lower wire. The lower wire includes a metal layer pattern and a conductive layer pattern, and the metal layer pattern has a protruding portion and the conductive layer pattern is formed on the upper part of the protruding portion of the metal layer pattern and has a hole to expose the protruding portion.

18 Claims, 4 Drawing Sheets

U.S. PATENT DOCUMENTS

| | | | |
|---|---|---|---|
| 6,200,892 | B1 | 3/2001 | Roberts et al. |
| 6,240,199 | B1 * | 5/2001 | Manchanda et al. .......... 382/124 |
| 6,261,751 | B1 * | 7/2001 | Forbes et al. ................ 430/510 |
| 6,727,179 | B2 | 4/2004 | Deleonibus |
| 6,987,038 | B2 | 1/2006 | Kim |
| 7,307,018 | B2 | 12/2007 | Chang et al. |
| 2001/0045651 | A1 * | 11/2001 | Saito et al. .................. 257/750 |
| 2002/0014695 | A1 * | 2/2002 | Hori et al. ................... 257/750 |
| 2002/0048942 | A1 | 4/2002 | Yamaguchi |
| 2005/0026409 | A1 | 2/2005 | Wu et al. |
| 2006/0278933 | A1 | 12/2006 | Endo |

FOREIGN PATENT DOCUMENTS

| | | |
|---|---|---|
| KR | 0147876 B1 | 5/1998 |
| KR | 10-2004-0079180 | 9/2004 |
| KR | 10-2005-066475 A | 6/2005 |

OTHER PUBLICATIONS

Sang Rok HA and Il Gu Kim; "Method for Forming Via-Contact Structure Using Dual Damascene Technique to Reduce Damage of Lower Wiring Due to Etch Process"; English Abstract of Korean Patent Publication No. 1020040079180 A; Publication Date: Sep. 14, 2004; Korean Intellectual Property Office; Republic of Korea.

Seung Bong Choi; "Method of Forming Metal Line in Semiconductor Device"; English Abstract of Korean Patent Publication No. 100147876 B1; Publication Date: May 20, 1998; Korean Intellectual Property Office; Republic of Korea.

Koji Kanda; "Forming Method for Wiring"; English Abstract of Japanese Patent Publication No. JP4352427; Publication Date: Dec. 7, 1992; esp@cenet database—Worldwide.

Peter Van Zant; "Microchip Fabrication A Practical Guide to Semiconductor Processing"; 2004; pp. 268-269; Fifth Edition; McGraw-Hill, New York, New York, US; ISBN 0-07-143241-8.

Stanley Wolf Ph.D. and Richard N. Tauber Ph.D.; "Silicon Processing for the VLSI Era"; 2000; pp. 684-686; vol. 1: Process Technology, Second Edition; Lattice Press, Sunset Beach, California, US; ISBN 0-9616721-6-1.

* cited by examiner

US 7,705,459 B2

SEMICONDUCTOR DEVICES AND METHODS OF FORMING INTERCONNECTION LINES THEREIN

RELATED APPLICATIONS

This application is a divisional of U.S. patent application Ser. No. 11/288,755, filed Nov. 29, 2005 now U.S. Pat. No. 7,432,198, which is incorporated herein by reference in its entirety. This application also claims the benefit of Korean Patent Application No. 10-2004-0107889, filed on Dec. 17, 2004, which is incorporated herein by reference in their entirety.

TECHNICAL FIELD

The present disclosure relates to semiconductor devices and, more particularly, to semiconductor devices and methods of forming interconnection lines therein.

BACKGROUND

Generally, wiring technology refers to a technology for realizing interconnections, power supplying routes, and signal transmission routes of transistors in an integrated circuit (IC).

Recently, as design rules have been reduced due to the higher integration of semiconductor devices, memory cells have been stacked. Therefore, interconnection lines are formed in a multi-layer structure in order to freely perform wiring design and easily set resistance and current capacities of interconnection lines.

In addition, as the aspect ratio of a contact hole or via hole has increased due to the reduction of design rules, multi-layer interconnection lines have been electrically connected with one another using a contact plug.

Additionally, a contact area has become larger because a contact hole or via hole has been formed at nearly the same width as a lower wire in order to ensure a contact resistance corresponding to higher integration.

Hereinafter, a conventional method of forming an interconnection line will be described in detail with reference to FIG. 1A to FIG. 1C.

Referring to FIG. 1A, a lower interlayer insulating layer 20 is formed on a semiconductor substrate 10, and a metal layer 30 used for a wiring material is deposited on the lower interlayer insulating layer 20. Subsequently, a first photoresist pattern 40 is formed on the upper part of the metal layer 30 by performing a photolithography process.

Referring to FIG. 1B, a lower wire 31 is formed by etching the metal layer 30 using the first photoresist pattern 40 (referring to FIG. 1A) as a mask, and the first photoresist pattern 40 is removed by a well-known method. Subsequently, an upper interlayer insulating layer 50 is formed on the lower interlayer insulating layer 20 in order to cover the lower wire 31, and a second photoresist pattern (not shown) is formed on the upper interlayer insulating layer 50 by performing a photolithography process.

Thereafter, a via hole 60 is formed by performing a plasma etching process using the second photoresist pattern as a mask, and the second photoresist pattern is removed by a well-known method. When the via hole 60 having nearly the same width as the lower wire 31 is formed, the lower wire 31 is exposed.

Referring to FIG. 1C, a tungsten layer used for a plug material is deposited on the entire surface of the substrate 10 in order to fill the via hole 60, and a tungsten contact plug 70 contacted with the lower wire 31 is formed by removing the tungsten layer through a chemical mechanical polishing (CMP) process to the degree that the upper interlayer insulating layer 50 can be exposed.

Subsequently, an upper wire 80 that is electrically connected to the lower wire 31 through the contact plug 70 is formed by depositing a metal layer used for a wiring material on the entire surface of the substrate 10, and by pattering the metal layer through a photolithography process and an etching process.

However, even if a contact is formed as mentioned above by forming the via hole 60 having nearly the same width with the lower wire 31, there is a limitation to increasing a contact area due to the higher integration of semiconductor devices.

In addition, the lower wire 31 may be severely damaged in the process of etching the upper interlayer insulating layer 50 because a substantial amount of polymer gases and physical etching factors, such as a high RF (Radio Frequency) power and a low pressure, are required to form the via hole 60 having the high aspect ratio by a plasma etching process.

Accordingly, characteristics and reliabilities of semiconductor devices are deteriorated because an excellent contact resistance characteristic corresponding to the higher integration can rarely be ensured.

Figure 1A:
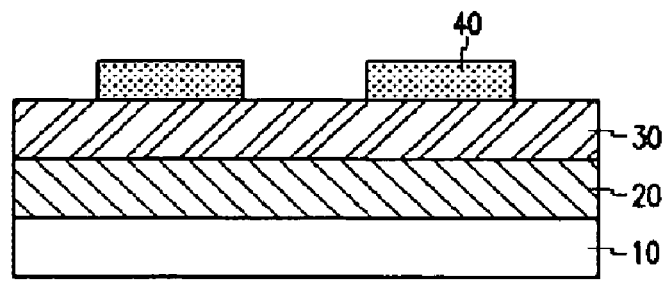
FIG. 1A to FIG. 1C are cross-sectional views showing sequential stages of a conventional method of forming an interconnection line of a semiconductor device.
Figure 1B:
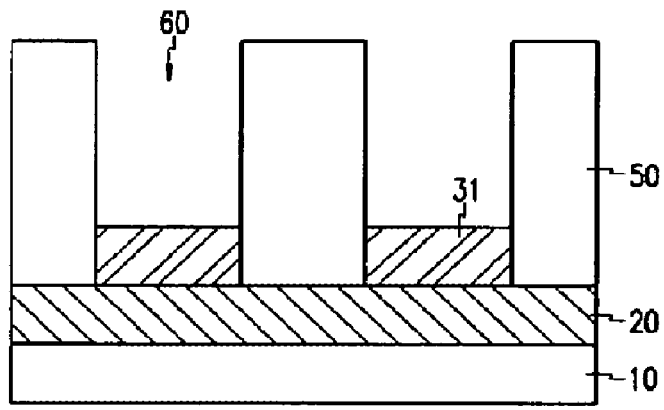
Figure 1C:
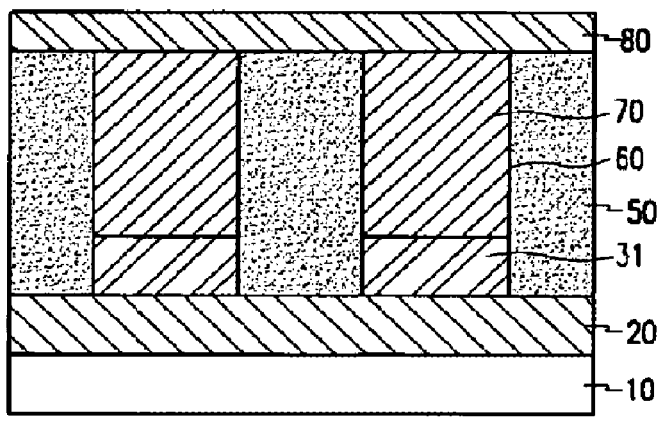

To clarify multiple layers and regions, the thickness of the layers are enlarged in the drawings. Wherever possible, the same reference numbers will be used throughout the drawing(s) and accompanying written description to refer to the same or like parts. As used in this patent, stating that any part (e.g., a layer, film, area, or plate) is in any way positioned on (e.g., positioned on, located on, disposed on, or formed on, etc.) another part, means that the referenced part is either in contact with the other part, or that the referenced part is above the other part with one or more intermediate part(s) located therebetween. Stating that any part is in contact with another part means that there is no intermediate part between the two parts.

DETAILED DESCRIPTION

Referring to FIG. 2A to FIG. 2H and FIG. 3, an example disclosed method of forming an interconnection line of a semiconductor device will be described.

Figure 2A:
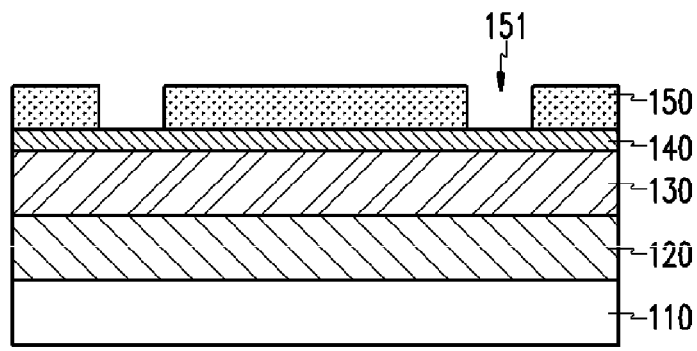
FIG. 2A to FIG. 2H are cross-sectional views showing sequential stages of an example disclosed method of forming an interconnection line of a semiconductor device.
Figure 3:
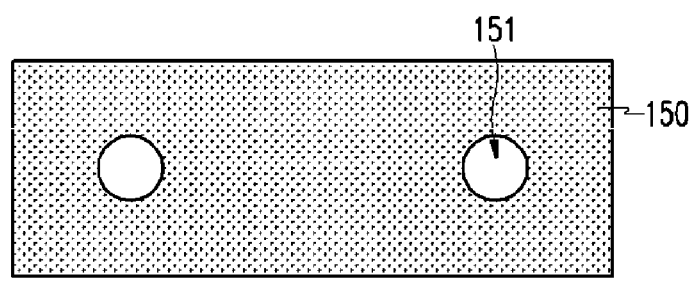
FIG. 3 is a top plan view of FIG. 2A and illustrates an example disclosed method of forming an interconnection line of a semiconductor device.

Referring to FIG. 2A and to FIG. 3, a lower interlayer insulating layer 120 is formed on a semiconductor substrate 110, and a metal layer 130 used for a wiring material is deposited on the lower interlayer insulating layer 120. Here, the metal layer 130 is a layer including one among Al, an Al—Cu alloy, Cu, W, Pt, Au, Ti, TiN, and TiW, and the metal layer 130 is deposited to a thickness of about 5000 Å.

Subsequently, a conductive layer, preferably a polysilicon layer 140, is deposited to a thickness of about 1000 Å on the upper part of the metal layer 130. The polysilicon layer 140 has higher hardness and high etch selectivity with respect to the metal layer 130 in order to prevent severe damage to the metal layer 130 caused by forming a via hole in a subsequent plasma etching process.

Thereafter, a first photoresist pattern 150 is formed on the upper part of the polysilicon layer 140 by performing a photolithography process. The first photoresist pattern 15 has a hole 151 to partially expose the polysilicon layer 140. Here, the hole 151 of the first photoresist pattern 150 has a smaller critical dimension (CD) than a second photoresist pattern which is formed into a wiring shape in a subsequent process, preferably being about 50% of that of the second photoresist pattern.

Figure 2B:
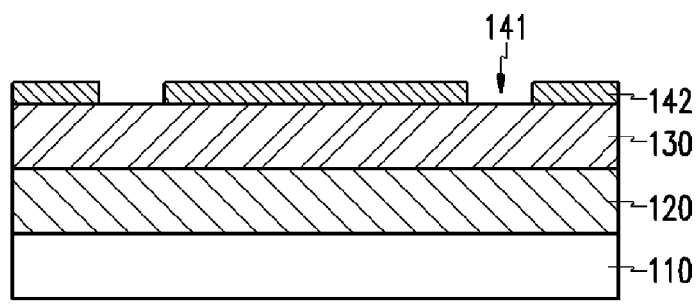

Referring to FIG. 2B, a first polysilicon layer pattern 142 is formed by etching the polysilicon layer 140 using the first photoresist pattern 150 (refer to FIG. 2A) as a mask. The first polysilicon layer pattern 142 has a hole 141 to expose the metal layer 130 and has the same CD as the hole 151 of the first photoresist pattern 150. Subsequently, the first photoresist pattern 150 is removed by a well-known method.

Figure 2C:
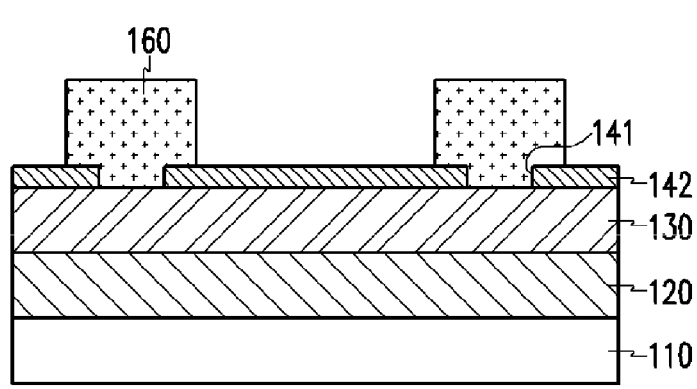

Referring to FIG. 2C, a second photoresist pattern 160 having a wiring shape is formed on the first polysilicon layer pattern 142 by performing a photolithography process. The second photoresist pattern 160 fills the hole 141 of the first polysilicon layer pattern 142 and masks the first polysilicon layer pattern 142 around the hole 141.

Figure 2D:
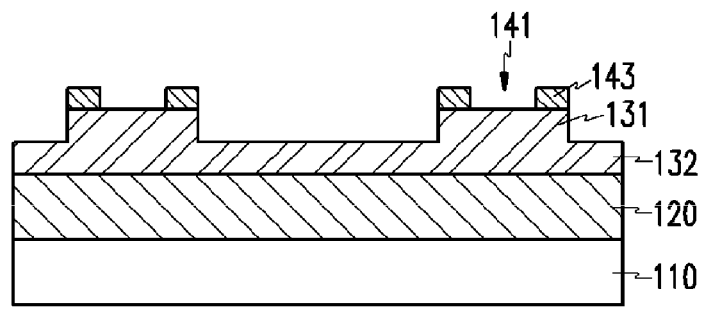

Referring to FIG. 2D, a second polysilicon layer pattern 143 is formed with spaces by etching the first polysilicon layer pattern 142 using the second photoresist pattern 160 (refer to FIG. 2C) as a mask, and then a first metal layer pattern 132 having a protruding portion 131 in a wiring shape is formed by partially etching the metal layer 130, preferably about 50 to 60% of the total thickness of the metal layer 130, using both the second polysilicon layer pattern 143 and the second photoresist pattern 160 as a mask.

Thereafter, the second photoresist pattern 160 is removed by a well-known method.

Figure 2E:
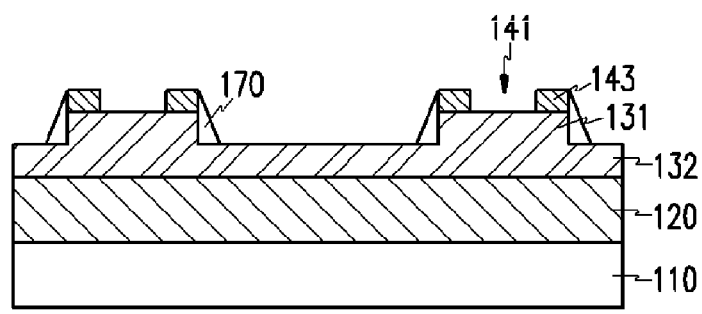

Referring to FIG. 2E, an insulating layer, which may be an oxide layer, is deposited to a thickness of about 1000 Å on the upper part of both the second polysilicon layer pattern 143 and the first metal layer pattern 132. The oxide layer is used for a spacer material. Subsequently, a spacer 170 is formed on the sidewalls of both the second polysilicon layer pattern 143 and the protruding portion 131 of the first metal layer pattern 132 by etching the oxide layer to the degree that the surface of the second polysilicon layer pattern 143 can be exposed.

Here, a process for etching the oxide layer may be performed using a gas plasma including F, such as $CF_4$, $C_2F_6$, $C_4F_8$, $CHF_3$, etc., under a power of 1000 to 2000 W and a pressure of 100 to 500 mTorr. In this case, when $CF_4$ gas is used for a gas plasma including F, the flow rate is adjusted to 50 to 200 sccm, and when $C_4F_8$ gas is used the flow rate is adjusted to 10 to 50 sccm. Moreover, when $CHF_3$ gas is used, the flow rate is adjusted to 20 to 100 sccm.

Figure 2F:
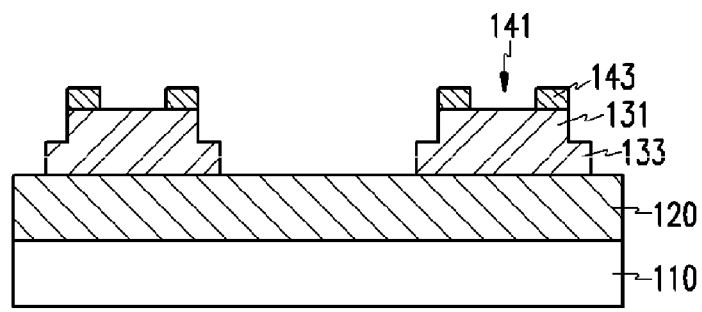

Referring to FIG. 2F, a second metal layer pattern 133 is formed with spaces by etching the first metal layer pattern 132 using the spacer 170 (refer to FIG. 2E) as a mask. The spacer 170 is consequently removed after forming a lower wire which is composed of the second polysilicon layer pattern 143 having the hole 141 and the second metal layer pattern 133 having the protruding portion 131.

Here, a process for etching the first metal layer pattern 132 is performed using a gas plasma including Cl, such as $Cl_2$, $BCl_3$, etc., under a power of 100 to 300 W and a pressure of 5 to 20 mTorr. In this case, when $Cl_2$ gas is used for a gas plasma including Cl, the flow rate is adjusted to 10 to 100 sccm, and when $BCl_3$ gas is used, the flow rate is adjusted to 10 to 100 sccm.

When the lower wire is composed of the second polysilicon layer pattern 143 having the hole 141 and the second metal layer pattern 133 having the protruding portion 131, a contact area of the lower wire contacted with a contact plug can be greatly increased due to the protruding portion 131 and the hole 141. Consequently, the contact resistance characteristic may be improved.

Figure 2G:
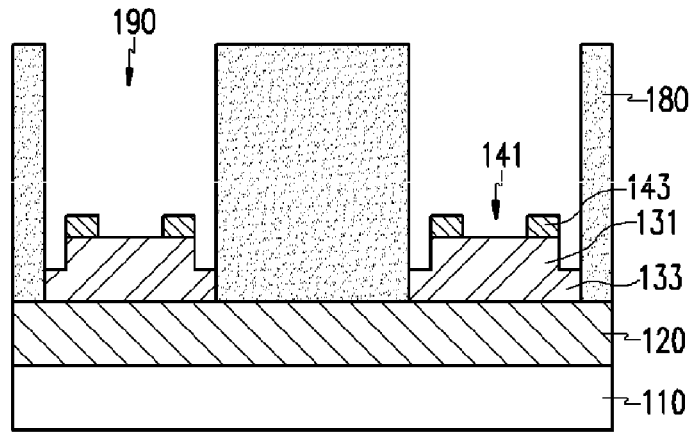

Referring to FIG. 2G, an upper interlayer insulating layer 180 is formed on the lower interlayer insulating layer 120 in order to cover the lower wire, and a third photoresist pattern (not shown) is formed on the upper interlayer insulating layer 180 by performing a photolithography process. Subsequently, a via hole 190 having nearly the same width as the second metal layer pattern 133 of the lower wire is formed by etching the upper interlayer insulating layer 180 using the third photoresist pattern as a mask to the degree that the lower wire is exposed. Thereafter, the third photoresist pattern is removed by a well-known method.

In this case, a process for etching the upper interlayer insulating layer 180 can be performed in two steps, a main etching step and an over-etching step. Main etching is performed using a gas plasma including F, such as $CF_4$, $CHF_3$, $C_4F_8$, etc., under a power of 1000 to 2000 W and a pressure of 50 to 100 mTorr and over-etching is performed using a gas plasma including F, such as $CF_4$, $SF_6$, etc., under a power of 100 to 500 W and a pressure of 100 to 500 mTorr.

In the case of main etching, when $CF_4$ gas is used for a gas plasma including F, the flow rate is adjusted to 50 to 200 sccm, and when $CHF_3$ gas is used, the flow rate is adjusted to 20 to 100 sccm. Moreover, when $C_4F_8$ gas is used, the flow rate is adjusted to 10 to 50 sccm.

In the case of over-etching, when $CF_4$ gas is used for a gas plasma including F, the flow rate is adjusted to 100 to 200 sccm, and when $SF_6$ gas is used, the flow rate is adjusted to 5 to 100 sccm.

Damage to the lower wire can be minimized because the second metal layer pattern 133 is protected by the second polysilicon layer pattern 143 which is formed on the upper part of the second metal layer pattern 133 of the lower wire.

While, according to one example, the spacer 170 is removed after forming a lower wire, the spacer 170 may be removed while etching the upper interlayer insulating layer 180 in order to form the via hole 190.

Figure 2H:
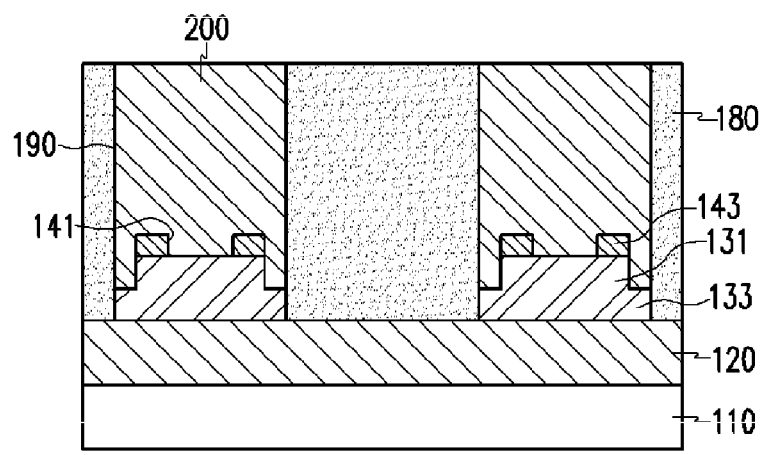

Referring to FIG. 2H, a tungsten layer used for a plug material is deposited on the entire surface of the substrate 110 in order to fill the via hole 190, and a contact plug 200 contacted with a lower wire is formed by removing the tungsten layer through a chemical mechanical polishing (CMP) process to the degree that the upper interlayer insulating layer 180 can be exposed.

Thereafter, although not shown, an upper wire electrically connected to a lower wire through the contact plug 200 is formed by depositing a metal layer used for a wiring material on the entire surface of the substrate 110, and by patterning the metal layer through a photolithography process and an etching process.

As described above, according to one example method, a lower wire includes a double-stacked layer of both a metal layer pattern including a protruding portion and a polysilicon layer pattern including a hole to expose the protruding portion of the metal layer pattern. Therefore, an excellent contact resistance characteristic corresponding to higher integration may be ensured because damage to a lower wire when forming a via hole can be minimized, and a contact area of the lower wire can be maximized. Consequently, characteristics and reliability of semiconductor devices can be improved.

The examples herein have been disclosed in an effort to provide a semiconductor devices and methods of forming interconnection lines therein. The disclosed examples are advantageous in that they ensure an excellent contact resistance characteristic corresponding to the higher integration by maximizing a contact area of an interconnection line and by preventing damage to a lower wire in the process of forming a via hole.

An example semiconductor device constructed as disclosed herein includes a semiconductor substrate, a lower interlayer insulating layer formed on the substrate, a lower wire formed on the lower interlayer insulating layer, and an upper interlayer insulating layer which is formed on the lower interlayer insulating layer and has a via hole to expose the lower wire. The lower wire includes a metal layer pattern and a conductive layer pattern, where the metal layer pattern has a protruding portion and the conductive layer pattern is formed on the upper part of the protruding portion of the metal layer pattern and has a hole to expose the protruding portion. In one example, the conductive layer pattern is composed of a polysilicon layer pattern which has a higher hardness than the metal layer pattern and high etch selectivity with respect to the metal layer pattern.

In addition, according to an example the hole of the conductive layer pattern may have a critical dimension of the protruding portion of about 50% of that of the metal layer pattern.

An example disclosed method of forming an interconnection line of a semiconductor device includes sequentially forming a metal layer and a conductive layer on a semiconductor substrate including a lower interlayer insulating layer, forming a first conductive layer pattern including a hole to partially expose the metal layer by patterning the conductive layer, forming a mask pattern which fills the hole of the first conductive layer pattern and masks the first conductive layer pattern around the hole, dividedly forming a second conductive layer pattern by etching the first conductive layer pattern using the mask pattern, forming a first metal layer pattern including a protruding portion by partially etching the metal layer to a predetermined thickness with the use of the mask pattern and the second conductive layer pattern, removing the mask pattern, forming a spacer on sidewalls of each of the second conductive layer pattern and the protruding portion of the first metal layer pattern, and forming a lower wire composed of the second conductive layer pattern and a second metal layer pattern, the second metal layer pattern being dividedly formed by etching the first metal layer pattern with the use of the spacer.

In such an arrangement, the conductive layer pattern may have a higher hardness than the metal layer pattern and high etch selectivity with respect to the metal layer pattern. In addition, the conductive layer pattern may be composed of a polysilicon layer pattern. Further, the hole of the first conductive layer pattern may have a critical dimension of about 50% of that of the mask pattern. Also, the forming of the first metal layer pattern may be performed by partially etching the metal layer to about 50 to 60% of the total thickness of the metal layer. The spacer may be composed of an oxide layer. The forming of the lower wire may be performed by etching the first metal layer pattern with the use of a gas plasma including Cl under a power of 100 to 300 W and a pressure of 5 to 20 mTorr.

An example disclosed method of forming an interconnection line of a semiconductor device may further include removing the spacer after forming the lower wire, forming an upper interlayer insulating layer on the lower interlayer insulating layer in order to cover the lower wire, and forming a via hole by etching the upper interlayer insulating layer to the degree that the lower wire is exposed.

In addition, after forming the lower wire, a disclosed example method of forming an interconnection line of a semiconductor device may further include forming an upper interlayer insulating layer on the lower interlayer insulating layer in order to cover the lower wire and the spacer, forming a via hole by etching the upper interlayer insulating layer to the degree that the lower wire is exposed, and removing the spacer while etching the upper interlayer insulating layer.

At this time, the etching of the upper interlayer insulating layer may include main etching and over-etching. The main etching may be performed using a gas plasma including F, such as $CF_4$, $CHF_3$, $C_4F_8$, etc., under a power of 1000 to 2000 W and a pressure of 50 to 100 mTorr, and the over-etching may be performed using a gas plasma including F, such as $CF_4$, $SF_6$, etc., under a power of 100 to 500 W and a pressure of 100 to 500 mTorr.

Although certain apparatus constructed in accordance with the teachings of the invention have been described herein, the scope of coverage of this patent is not limited thereto. On the contrary, this patent covers every apparatus, method and article of manufacture fairly falling within the scope of the appended claims either literally or under the doctrine of equivalents.

What is claimed is:

1. A semiconductor device, comprising:
    a semiconductor substrate;
    a lower insulating layer on the substrate;
    a lower wire on the lower insulating layer, wherein the lower wire comprises a metal layer pattern and a conductive layer pattern, and the metal layer pattern has a protruding portion and the conductive layer pattern is on an upper part of the protruding portion of the metal layer pattern and has a hole to expose the protruding portion;
    an upper insulating layer on the lower insulating layer that has a via hole to expose the lower wire, wherein the via hole exposes all of the protruding portion of the metal layer pattern and the conductive layer pattern; and
    a contact plug in the via hole that is electrically connected to the lower wire.

2. The semiconductor device of claim 1, wherein the conductive layer pattern has a higher hardness than the metal layer pattern and high etch selectivity with respect to the metal layer pattern.

3. The semiconductor device of claim 2, wherein the conductive layer pattern comprises a polysilicon layer.

4. The semiconductor device of claim 1, wherein the hole of the conductive layer pattern has a dimension of about 50% of a width of the protruding portion of the metal layer pattern.

5. The semiconductor device of claim 1, wherein the protruding portion of the metal layer pattern has a thickness of about 50 to 60% of the total thickness of the metal layer pattern.

6. The semiconductor device of claim 1, wherein the conductive layer pattern is on edges of the protruding portion of metal layer pattern.

7. The semiconductor device of claim 1, further comprising an upper wire that is electrically connected to the contact plug.

8. The semiconductor device of claim 1, wherein the contact plug comprises tungsten.

9. The semiconductor device of claim 5, wherein the total thickness of the metal layer pattern is about 5000 Å.

10. The semiconductor device of claim 1, wherein the metal layer pattern comprises Al, aluminum-copper alloy, Cu, W, Pt, Au, Ti, TiN, or TiW.

11. The semiconductor device of claim 1, wherein the conductive layer pattern has a thickness of about 1000 Å.

12. The semiconductor device of claim 1, wherein the via hole exposes portions of the metal layer pattern that are adjacent to the protruding portion of the metal layer pattern.

13. The semiconductor device of claim 12, wherein the contact plug contacts upper and side surfaces of the protruding portion of the metal layer pattern and the conductive layer pattern, and the exposed portions of the metal layer pattern that are adjacent to the protruding portion of the metal layer pattern.

14. The semiconductor device of claim 1, wherein the conductive layer pattern has a high etch selectivity with respect to the metal layer pattern.

15. The semiconductor device of claim 1, wherein the conductive layer path has higher hardness than the metal layer pattern.

16. The semiconductor device of claim 1, wherein the metal layer pattern comprises Al or aluminum-copper alloy.

17. The semiconductor device of claim 4, wherein the protruding portion of the metal layer pattern has a thickness of about 50 to 60% of the total thickness of the metal layer pattern.

18. The semiconductor device of claim 7, wherein the contact plug comprises tungsten.

* * * * *